US009590598B2

(12) United States Patent
Sharma et al.

(10) Patent No.: US 9,590,598 B2
(45) Date of Patent: Mar. 7, 2017

(54) FAULT RESISTANT FLIP-FLOP

(71) Applicant: NXP B.V., Eindhoven (NL)

(72) Inventors: Vibhu Sharma, Nijmegen (NL); Ralf Malzahn, Seevetal (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/863,369

(22) Filed: Sep. 23, 2015

(65) Prior Publication Data

US 2016/0087611 A1 Mar. 24, 2016

(30) Foreign Application Priority Data

Sep. 23, 2014 (EP) ..................... 14185964

(51) Int. Cl.
*H03K 3/037* (2006.01)
*H03K 3/3562* (2006.01)
*H03K 3/011* (2006.01)

(52) U.S. Cl.
CPC ........... *H03K 3/0372* (2013.01); *H03K 3/011* (2013.01); *H03K 3/0375* (2013.01); *H03K 3/35625* (2013.01)

(58) Field of Classification Search
CPC ...... H03K 3/011; H03K 3/013; H03K 3/0372; H03K 3/0375; H03K 3/3562; H03K 3/35625
See application file for complete search history.

(56) References Cited

U.S. PATENT DOCUMENTS

| 5,126,279 | A | 6/1992 | Roberts |
| 5,140,179 | A * | 8/1992 | Takano ............... H03K 3/3562 327/203 |
| 5,155,382 | A | 10/1992 | Madden et al. |
| 5,301,146 | A | 4/1994 | Hama |
| 5,307,142 | A | 4/1994 | Corbett et al. |
| 5,942,916 | A * | 8/1999 | Matsbara .............. H03K 3/037 326/17 |
| 7,482,831 | B2 | 1/2009 | Chakraborty et al. |
| 7,622,976 | B2 * | 11/2009 | Clark .................. H03K 3/3562 327/202 |
| 7,661,046 | B2 | 2/2010 | Rickert et al. |
| 7,719,304 | B1 | 5/2010 | Clark et al. |
| 9,148,149 | B2 * | 9/2015 | Cheng ............. H03K 19/09429 |
| 2004/0252546 | A1 | 12/2004 | Liaw |
| 2005/0235179 | A1 | 10/2005 | Pistoulet |

(Continued)

FOREIGN PATENT DOCUMENTS

EP 0 467 273 A2 1/1992
EP 0 758 820 A1 2/1997

OTHER PUBLICATIONS

Skorobogatov, S. P. et al. "Optical Fault Induction Attacks", International Workshop on Cryptographic Hardware and Embedded Systems, 11 pgs (Jan. 1, 2003).

(Continued)

*Primary Examiner* — Patrick O'Neill

(57) ABSTRACT

A flip-flop (10) is disclosed comprising a slave latch (30) and a master latch (20). Each of the slave and master latch comprise a pair of cross-coupled logic gates (21, 22, 31, 32). A cross coupling connection of the slave or master latch (30, 20) comprises a resistive element (8, 9, 11, 12) arranged to reduce the sensitivity of the flip-flop (10) to a current injection.

14 Claims, 3 Drawing Sheets

(56) References Cited

U.S. PATENT DOCUMENTS

2012/0223756 A1    9/2012    Afghahi

OTHER PUBLICATIONS

Extended European Search Report for Patent Appln. No. 14185964.5 (Mar. 5, 2015).
Zhang, M. et al. "Sequential Element Design With Built-In Soft Error Resilience", IEEE Transactions on Very Large Scale Integration (VLSI) Systems, vol. 14, No. 12, pp. 1368-1378 (Dec. 2006).
Krueger, D. et al. "Circuit Design for Voltage Scaling and SER Immunity on a Quad-Core Itanium Processor", IEEE International Solid-State Circuits Conference—Digest of Technical Papers, pp. 94-95 (2008).

* cited by examiner

US 9,590,598 B2

FAULT RESISTANT FLIP-FLOP

CROSS-REFERENCE TO RELATED APPLICATIONS

This application claims the priority under 35 U.S.C. §119 of European patent application no. 14185964.5, filed on Sep. 23, 2014, the contents of which are incorporated by reference herein.

FIELD

The invention relates to a flip-flop with enhanced resilience to faults arising from current injection (for example due to optical attack).

BACKGROUND

Illumination of a transistor can generate carriers, causing the transistor to conduct. This can be used to inject a fault into a flip-flop, for example to switch one or more bits in the SRAM (static random access memory) of a microcontroller. Such optical probing can be used to introduce errors in secure computations or protocols, and may provide a technique for attacking a secure microcontroller.

In order to protect flip-flops from optical attacks, several redundant flip-flop structures have been proposed, such as triple modular redundancy (see U.S. Pat. No. 7,482,831), dual interlock storage cell (see U.S. Pat. No. 7,661,046), built in soft error resilience (M. Zhang et. al, "Sequential element design with built in soft error resilience, IEEE Trans. VLSI Systems, Vol. 4, Issue 12, December 2006, pages 1368-1378), and radiation hardening by design master-slave flip-flop (see U.S. Pat. No. 7,719,304). Currently, processors for servers are implemented with some redundancy to guarantee reliability (D. Krueger et. al., "Circuit design for voltage scaling and SER immunity on a quad-core ITANIUM processor," in Proc. ISSCC, February 2008, pp. 94-95). Redundancy for critical elements, such as a control flip-flop chain, may be necessary for designing smart and secure microcontrollers.

Conventional attack resistant redundant flip-flops have large area, high power overhead, and no mechanism for increased immunity to optical attack in each individual flip-flop. It is very hard to reduce the area penalty associated with redundant designs, because redundancy requires duplication of logical gates, resulting in additional transistors that inevitably increase area.

A flip-flop architecture with enhanced resistance to optical attack that reduces the area and/or power overhead associated with prior art designs is desired.

SUMMARY

According to a first aspect of the invention, there is provided a flip-flop comprising a slave latch and a master latch, each of the slave and master latch comprising a pair of cross-coupled logic gates, wherein a cross coupling connection of the slave or master latch comprises a resistive element arranged to reduce the sensitivity of the flip-flop to a current injection (e.g. resulting from optical attack).

The pair of cross-coupled logic gates of the master latch may comprise a forward inverter and a reverse inverter, and the pair of cross-coupled logic gates of the slave latch may comprise a forward inverter and a reverse inverter, wherein a connection between the cross-coupled inverters of the slave latch, or of the master latch, comprises the series resistive element.

The resistive element reduces a change in voltage at an input node of an inverter as a result of fault current injected by an optical attack on the corresponding cross-coupled inverter, because a voltage will be dropped across the resistive element as a result of the fault current flowing through it. A similar benefit results from a resistor in the cross-coupling connection between a latch comprising a different logic gate (e.g. a NOR gate or NAND gate based latch).

Both connections between the cross-coupled logic gates of the slave latch may comprise a series resistive element. Both connections between the cross-coupled logic gates of the master latch may comprise a series resistive element. Both connections between the cross coupled logic gates of the slave latch and the master latch may comprise a series resistive element. In some embodiments, the reduction in sensitivity of the flip-flop to current injection may be achieved by arranging a single resistive element to protect a single node of the flip-flop from current injection attack (e.g. optical attack). In other embodiments, a subset of any of the nodes, or all the nodes, may be protected by a resistive element.

A resistive element may mean an element with an effective resistance of at least 1 ohm, 5 ohms, 10 ohms, 25 ohms, 50 ohms, 100 ohms, 500 ohms, 1 kohm, 5 kohms, 10 kohms, 50 kohms, 100 kohms, 500 kohms, or 1 Mohm. The value of the resistance may be selected based on the level of immunity required, balanced against the constraints on area of the flip-flop. Resistive elements protecting different nodes of the flip-flop may have a different resistance. For example, a resistive element (or elements) protecting the master latch may have a different resistance to the resistive elements protecting the slave latch.

At least one resistive element may comprise a polysilicon resistor or a voltage controlled resistor. Resistive elements protecting different nodes of the flip-flop may be implemented in different ways. For example, the resistive element (or elements) protecting an input node to the forward and/or reverse inverter of the master latch may comprise a polysilicon resistor, and a resistive element (or elements) protecting the forward and/or reverse inverter of the slave latch may comprise a voltage controller resistor. Any appropriate resistive element may be used to protect any of the nodes of the flip-flop. A voltage controlled resistor may comprise an NMOS transistor.

The flip-flop may further comprise: a first clock gated transistor connected to the input node of the forward cross-coupled inverter of the master latch; and a second clock gated transistor connected to the input node of the forward cross-coupled inverter of the slave latch, wherein the first and second clock gated transistors synchronise the operation of the master and slave latch with a clock signal. A similar arrangement of clock gated transistors may be used to synchronise a flip-flop formed using other types of logic gate.

According to a second aspect of the invention, there is provided a flip-flop comprising a slave latch and a master latch, each of the slave and master latch comprising a pair of cross-coupled inverters, each cross-coupled inverter comprising a forward inverter and a reverse inverter; a first clock gated transistor connected to the input node of the forward cross-coupled inverter of the master latch; and a second clock gated transistor connected to the input node of the forward cross-coupled inverter of the slave latch, wherein the first and second clock gated transistors synchronise the operation of the master and slave latch with a clock signal.

The following features are applicable to both the first and second aspect.

The use of clock gated transistors at input nodes of the master and slave latches enables a flip-flop with a single phase clock input that does not include a clock inverter or clock buffer. The flip-flop does not include a clock inverter that is charged and discharged with each clock cycle. Charging and discharging the capacitance of a clock buffer and/or clock inverter is a significant component of the power consumption of a flip-flop, and this power consumption is incurred for every clock cycle, regardless of whether data is toggled. In many applications, the data toggling rate is relatively low, which causes the chip buffer/inverter cycling to consume a relatively larger fraction of the overall power consumed by the flip-flop.

In some embodiments, the first clock gated transistor is a PMOS transistor, and the second clock gated transistor is an NMOS transistor. This arrangement may be appropriate for a positive clock edge triggered flip-flop. In a negative edge triggered flip-flop, the first clock gated transistor may be an NMOS transistor and the second clock gated transistor may be a PMOS transistor.

The flip-flop may further comprise a third clock gated transistor connected to the input node of the reverse cross-coupled inverter of the master latch; and a fourth clock gated transistor connected to the input node of the reverse cross-coupled inverter of the slave latch; wherein the first, second, third and fourth clock gated transistors synchronise the operation of the master and slave latch with a clock signal.

The third clock gated transistor may be a PMOS transistor, and the fourth clock gated transistor may be an NMOS transistor. This arrangement may be appropriate for a positive clock edge triggered flip-flop. In a negative edge triggered flip-flop, the third clock gated transistor may be an NMOS transistor and the fourth clock gated transistor may be a PMOS transistor.

In a clock gated architecture with no clock buffer/inverter, the internal capacitances of the flip-flop circuit only charges and discharges when data is toggled, thereby reducing current consumed by the flip-flop when data is not being toggled.

At least one of the forward and reverse inverter of the slave latch may be connected to a voltage supply via a transistor that is controlled by a voltage at a node of the master latch. This arrangement allows the voltage supply for the slave latch to float, dependant on the node voltages of the master latch. The slave latch can therefore be configured to reduce contention between the master and slave latches, which in turn enables a smaller master latch. In addition, this controlled floating supply voltage arrangement provides additional immunity against fictitious triggering caused by a rise in voltage level of the internal input nodes of the slave latch, because the voltages supplied to the inverters of the slave latch are not controlled by these nodes (but instead by nodes in the master latch). There is therefore a synergistic effect between this feature and the resistor used to increase resistance to current injection.

Both of the forward and reverse inverter of the slave latch may be connected to a voltage supply via a transistor that is controlled by a voltage at a node of the master latch; the transistor connecting the forward inverter of the slave latch to the voltage supply may be configured to cause the voltage supplied to the forward inverter of the slave latch to float when the output node of the reverse inverter of the master latch is high; and the transistor connecting the reverse inverter of the slave latch to the voltage supply is configured to cause the voltage supplied to the reverse inverter of the slave latch to float when the output node of the forward inverter of the master latch is high.

This arrangement is one example of how contention between the master and slave latch can be reduced, at the same time as improving resistance to optical attack. The data dependent floating supply voltage allows the state of the slave latch to be more easily changed by the master latch.

At least one of the forward and reverse inverter of the master latch is connected to a voltage supply via a transistor that is controlled by a data voltage.

A similar floating supply voltage arrangement may be adopted to make changing the state of the master latch easier. This may reduce the required size of components used to buffer the input data signal.

Both of the forward and reverse inverter of the master latch may be connected to a voltage supply via a transistor that is controlled by a data voltage; the transistor connecting the forward inverter of the master latch to the voltage supply may be configured to cause the voltage supplied to the forward inverter of the master latch to float when the data voltage is high; and the transistor connecting the reverse inverter of the master latch to the voltage supply may be configured to cause the voltage supplied to the reverse inverter of the master latch to float when the data voltage is low.

According to a third aspect of the invention, there is provided a memory module, microcontroller or electronic device comprising the flip-flop of the first or second aspect.

The memory module, microcontroller or electronic device may comprise a plurality of flip-flops of the first or second aspect, wherein at least some of the flip-flops are configured in a redundant micro-architecture.

The low power consumption of flip-flops according to an embodiment results in lower power consumption, enabling redundant micro-architectures with a reduced power consumption penalty.

These and other aspects of the invention will be apparent from, and elucidated with reference to, the embodiments described hereinafter.

Figure 1:
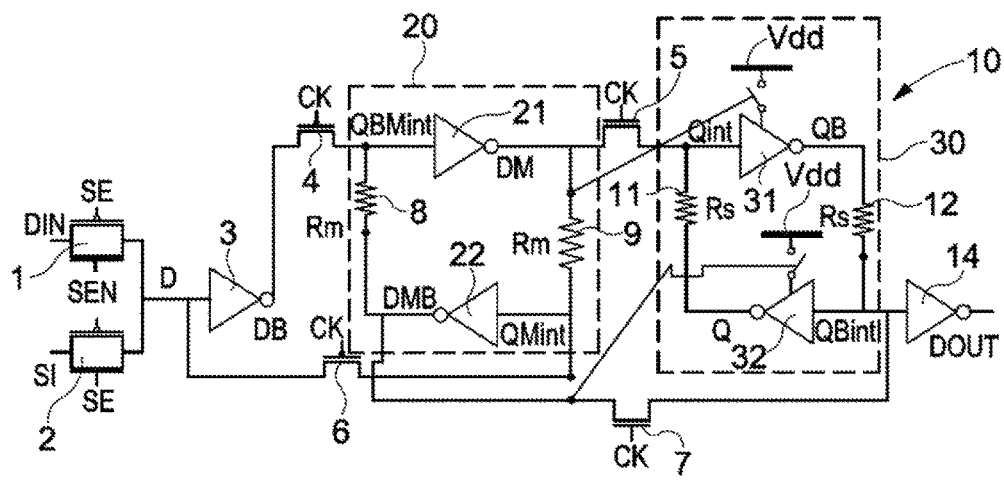
FIG. 1 is schematic circuit diagram of a flip-flop according to an embodiment.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

From reading the present disclosure, other variations and modifications will be apparent to the skilled person. Such variations and modifications may involve equivalent and other features which are already known in the art of flip-flops, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

Referring to FIG. 1, a flip-flop 10 is shown, comprising a master latch 20 and a slave latch 30. The master latch 20 comprises a pair of cross-coupled inverters: a forward inverter 21 and reverse inverter 22. The cross coupling connection between the output node DM of the forward inverter 21 and the input node QMint of the reverse inverter 22 comprises a resistive element 9 (in series). The cross coupling connection between the output node DMB of the reverse inverter 22 and the input node QBMint of the forward inverter 21 comprises a resistive element 8 (in series).

The slave latch 30 comprises a pair of cross-coupled inverters: a forward inverter 31 and reverse inverter 32. Similarly to the master latch 20, the cross coupling connection between the output node QB of the forward inverter 31 and the input node QBint of the reverse inverter 32 comprises a resistive element 12 (in series). The cross coupling connection between the output node Q of the reverse inverter 32 and the input node Qint of the forward inverter 31 comprises a resistive element 11 (in series).

In this embodiment the resistors 8 and 9 of the master latch 20 have a first resistance Rm, and the resistors 11 and 12 of the slave latch 30 have a second resistance Rs. Depending on the design requirements for the flip-flop, Rm may be greater than Rs, or vice versa, or Rm may be substantially equal to Rs. In some embodiments each resistor 8, 9, 11, 12 may be designed with a different value.

In some embodiments the resistive elements may comprise voltage controlled resistors. A suitable voltage controlled resistor may comprise an NMOS device, having a gate length, for example, of between 50 nm and 150 nm, and a gate width, for example, of between 100 nm and 200 nm. In one embodiment the gate length may be approximately 80 nm and the gate width may be approximately 150 nm. In other embodiments a resistive element (or elements) may comprise a polysilicon resistor.

The flip-flop in this embodiment is a scan flip-flop, having a data input DIN, a scan enable input SE, a scan in input SI and a data output DOUT. A first and second transmission gate 1 and 2, each comprising a complementary NMOS and PMOS transistor, have their respective outputs connected in parallel to the data node D. The data input DIN is connected to the input of the first transmission gate 1, and the scan in input SI is connected to the input of the second transmission gate 2. The scan enable input SE is connected to the gate of the PMOS transistor of the first transmission gate 1, and an inverted version of the scan enable input SEN is connected to the NMOS transistor of the first transmission gate 1. The scan enable input SE is connected to the gate of the NMOS transistor of the second transmission gate 2, and an inverted version of the scan enable input SEN is connected to the PMOS transistor of the second transmission gate 2.

The data node D forms the input node of a data inverter 3. The output of the data inverter 3 is connected to the input node QBMint of the master latch 20 (which is also the input node of the forward inverter 21) via a clock gated transistor 4. The clock gated transistor 4 is a PMOS transistor, effectively only coupling the output of the data inverter 3 to the node QBMint when the clock CK is low. The data node D is also connected via a PMOS clock gated transistor 6 to the node QMint at the input of the reverse inverter 22.

The output node DM of the forward inverter 21 of the master latch 20 is connected via a clock gated transistor 5 to the input node Qint of the forward inverter 31 of the slave latch 30. The output node DMB of the reverse inverter 22 of the master latch 20 is connected via a clock gated transistor 7 to the input node QBint of the reverse inverter 32 of the slave latch 30. Both clock gated transistors 5 and 7 are NMOS transistors.

This arrangement of PMOS clock gated transistors 4 and 6 and NMOS clock gated transistors 5 and 7 may be appropriate for a positive edge triggered flip-flop. In an alternative embodiment (negative edge triggered) the clock gated transistors 4 and 6 may be NMOS devices and clock gated transistors 5 and 7 may be PMOS devices.

The input node QBint of the reverse inverter 32 of the slave latch is connected to the input of an output inverter 14, which has an output node DOUT.

The forward inverter 31 is connected to the voltage supply Vdd via a switch that is controlled by the voltage at node DM. The reverse inverter 32 is connected to the voltage supply Vdd via a switch that is controlled by the voltage at node DMB. The supply voltage to the forward inverter 31 and reverse inverter 32 of the slave latch is therefore controlled by the state of the master latch 20. The voltage supplied to the inverters 31 and 32 is made to float, depending on the voltages of the output nodes at the inverters 21, 22 of the master latch 20. This reduces contention between the master latch 20 and slave latch 30, meaning that the master latch 20 can be reduced in area, because the transistors of the inverters 21 and 22 are not required to drive as much current. As already discussed, it also improves resistance to current injection attacks, because a voltage rise at the input node Qint or QBint will not turn on the supply voltage to the inverters 31, 32 of the slave latch 30. The supply voltages at these inverters 31, 32 is instead controlled by the voltages at nodes DM and DMB of the master latch 20.

Although an embodiment is shown in which the latches 21, 22, 31, 32 comprise cross coupled inverters, alternative embodiments are possible in which the latches comprise other types of logic gate. For example, latches may be constructed from cross-coupled NOR gates or NAND gates. The skilled person will understand how to adapt the teaching of the example embodiments to latches comprising different types of logic gates to achieve similar technical advantages.

Figure 2:
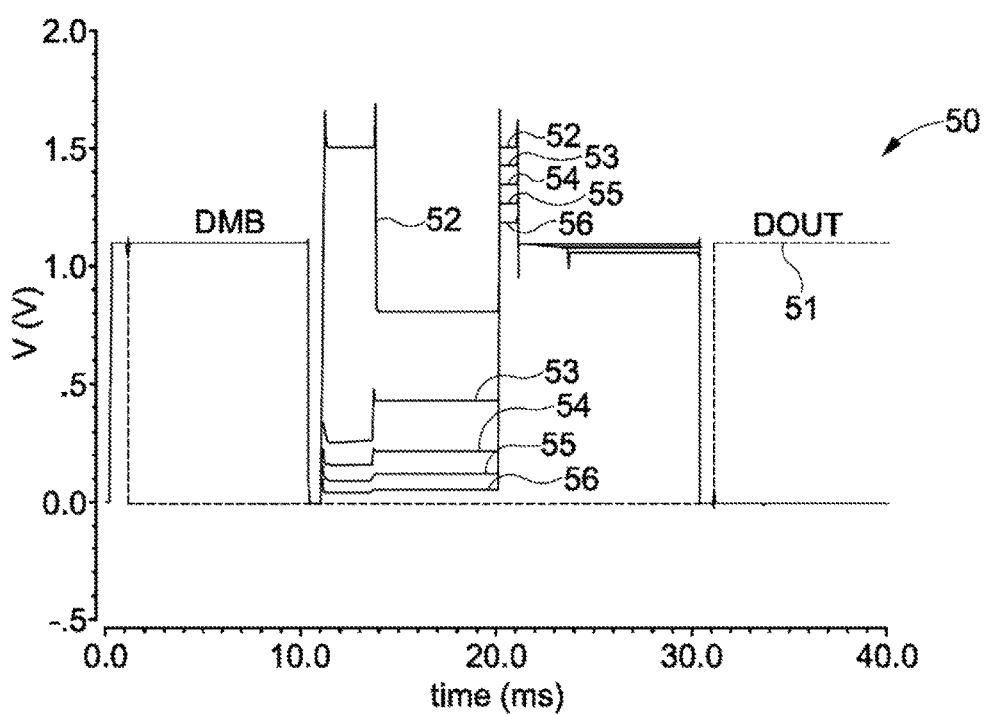
FIG. 2 is a graph showing the response of a flip-flop according to an embodiment to a current pulse.

Referring to FIG. 2 a simulation of the response of a flip-flop according to an embodiment is shown. A graph 50 of the voltage at node DMB and node DOUT is shown with respect to time, for various levels of current injection at node DM. Curves 52, 53, 54, 55, and 56 correspond to injected currents of 125, 100, 75, 50 and 25 microamps with duration 10 ns. As shown in the graph, the flip-flop according to an embodiment is resilient to injected currents of up to 115 microamps, which compares favourably with a limit of resilience of only 15 microamps of injected current for a similar flip-flop according to the prior art (without the resistive elements 8, 9, 11, 12).

Figure 3:
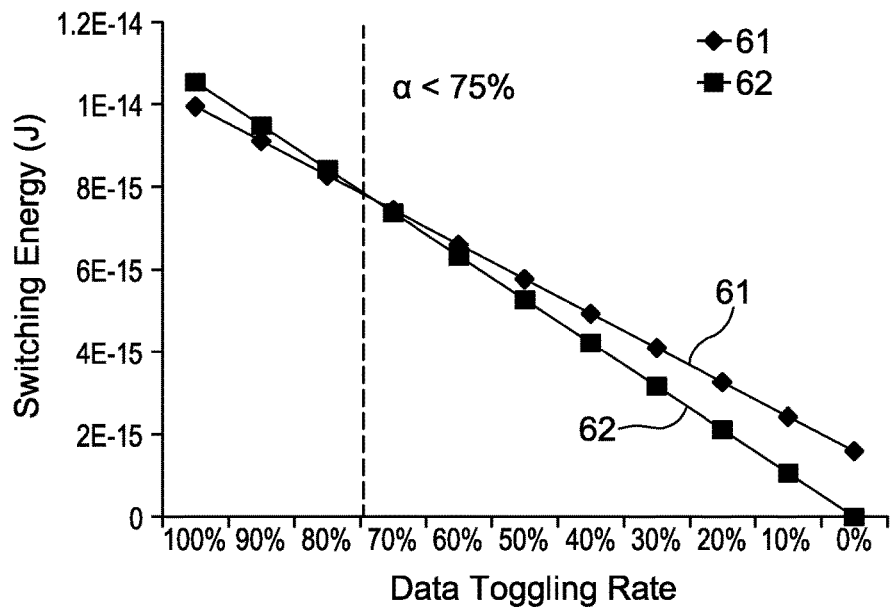
FIG. 3 is a graph showing switching energy vs. data toggling rate for a flip-flop according to an embodiment, compared with a flip-flop according to the prior art.

FIG. 3 shows the efficiency of a flip-flop according to an embodiment. A graph 60 is shown, showing switching energy in Joules against data toggling rate for an flip-flop according to an embodiment 62 and a flip-flop according to the prior art 61. The prior art flip-flop is a synchronous design with a clock inverter which is charged and discharged each clock cycle. For data toggling rates below 75%, the flip-flop according to an embodiment uses less energy, primarily because it does not need to drive active clock components in the flip-flop each clock cycle regardless of data toggling. At a data toggling rate of 40%, an embodiment of the invention reduces power consumption by 16%.

Figure 4:
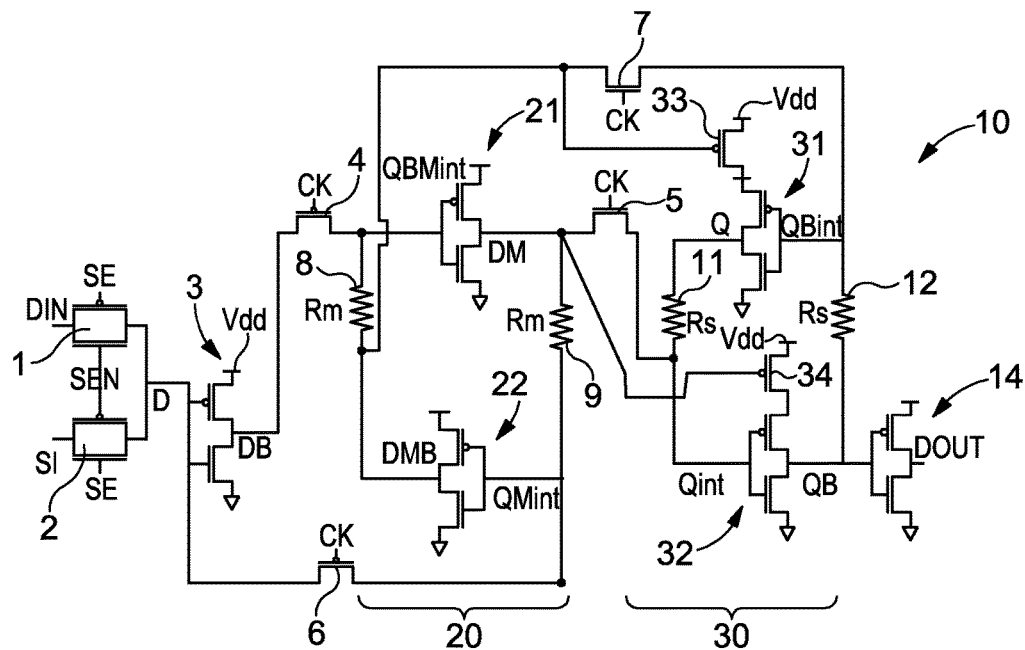
FIG. 4 is a circuit diagram of an example flip-flop according to an embodiment, in which the supply voltages at the slave latch inverters are controlled by voltages at nodes of the master latch.

FIG. 4 shows a possible implementation of a flip-flop 10 according to an embodiment. The architecture is similar to that shown in FIG. 1. Each of the inverters 21, 22, 31, 32 comprises a complementary NMOS and PMOS transistor. Vdd is supplied to the inverter 31 via PMOS transistor 33, which has its gate connected to node DMB. Vdd is supplied to the inverter 32 via PMOS transistor 34, which has its gate connected to node DM. The transistors 33 and 34 cause the supply voltage to the slave latch 30 to float, depending on the voltages of the nodes DM and DMB of the master latch 20, thereby reducing contention between the master and slave latches 20, 30.

Figure 5:
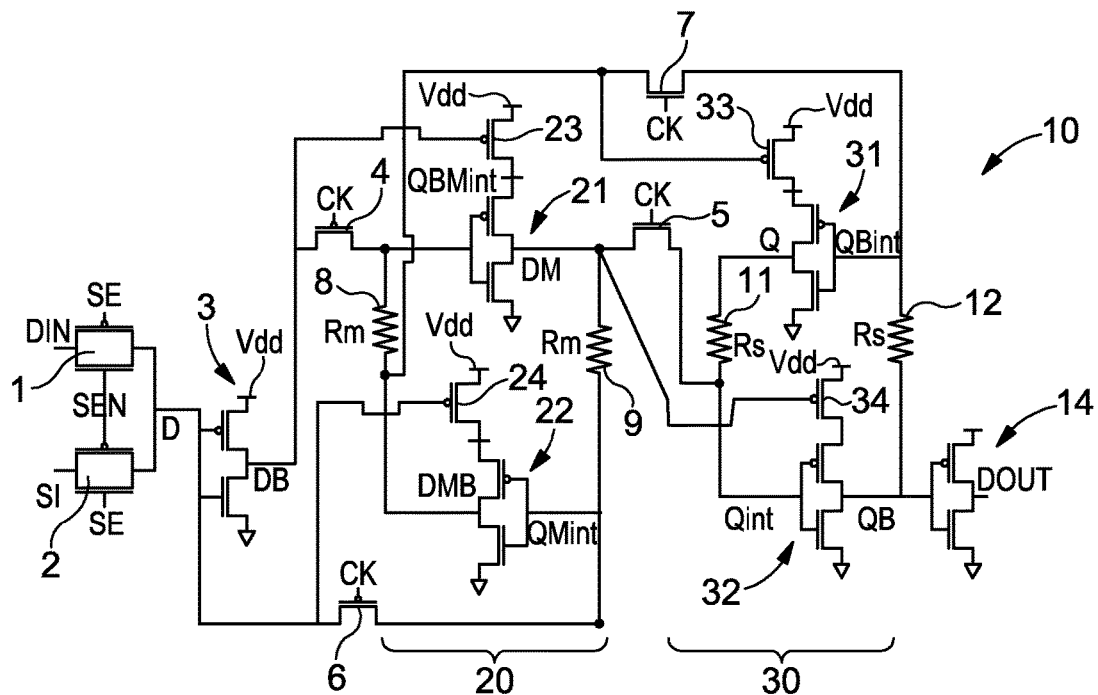
FIG. 5 is a circuit diagram of a flip-flop according to an embodiment, in which the supply voltages at the master latch inverters are controlled by data voltages, and the supply voltages at the slave latch inverters are controlled by voltages at nodes of the master latch.

FIG. 5 shows another possible implementation of a flip-flop 10 according to an embodiment. The architecture is similar to that shown in FIG. 4, but the supply voltages to the master latch 20 are controlled by the data input voltages at nodes D and DB. This is achieved by connecting the supply voltage Vdd to the inverter 21 via PMOS transistor 23, which has its gate connected to node DB, and by connecting the supply voltage Vdd to the inverter 22 via PMOS transistor 24, which has its gate connected to node D. This causes the supply voltages for the master latch 20 to float depending on the input data, making it easier to change the state of the master latch 20, potentially reducing the necessary size of the data input buffering components (such as inverter 3).

Figure 6:
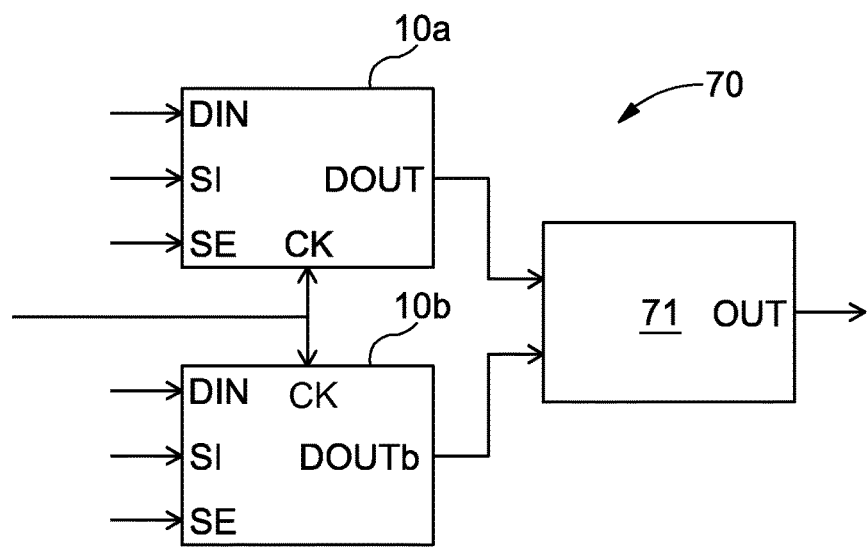
FIG. 6 is a schematic block diagram of an example of a redundancy based microarchitecture for an electronic device to protect against optical attacks.

FIG. 6 shows an example of a redundancy based microarchitecture 70 for an electronic device, to protect against optical attacks. First and second flip-flops 10a, 10b according to an embodiment are provided. Data is connected to the first flip-flop 10a, and data is connected to the second flip-flop 10b. Both flip-flops 10a and 10b are preferably connected to a common clock. The output of the second flip-flop 10b should always correspond with that of the first flip-flop 10a. The outputs from the first and second flip-flop DOUT and DOUTb are provided to a keeper 71, which may comprise a Muller gate. The keeper 71 may only change output value if both DOUT and DOUTb change.

A number of other variations will be apparent to the skilled person. Any such variations are intentionally within the scope of the invention, which is limited only by the appended claims.

The invention claimed is:

1. A flip-flop comprising a slave latch and a master latch, each of the slave and master latch comprising a pair of cross-coupled logic gates, wherein a cross coupling connection of the slave or master latch comprises a resistive element arranged to reduce the sensitivity of the flip-flop to a current injection, wherein at least one of the logic gates of the slave latch is connected to a voltage supply via a transistor that is controlled by a voltage at a node of the master latch.

2. The flip-flop of claim 1, wherein at least one resistive element comprises a polysilicon resistor or a voltage controlled resistor.

3. The flip-flop of claim 1, wherein the pair of cross-coupled logic gates of the master latch comprise a forward inverter and a reverse inverter, and the pair of cross-coupled logic gates of the slave latch comprise a forward inverter and a reverse inverter.

4. The flip-flop of claim 3, further comprising:
   a first clock gated transistor connected to the input node of the forward cross-coupled inverter of the master latch; and
   a second clock gated transistor connected to the input node of the forward cross-coupled inverter of the slave latch,
   wherein the first and second clock gated transistors synchronise the operation of the master and slave latch with a clock signal.

5. The flip-flop of claim 4, wherein the flip-flop does not include a clock inverter that is charged and discharged with each clock cycle.

6. The flip-flop of claim 4, wherein the first clock gated transistor is a PMOS transistor, and the second clock gated transistor is an NMOS transistor.

7. The flip-flop of claim 4, further comprising:
   a third clock gated transistor connected to the input node of the reverse cross-coupled inverter of the master latch; and
   a fourth clock gated transistor connected to the input node of the reverse cross-coupled inverter of the slave latch;
   wherein the first, second, third and fourth clock gated transistors synchronise the operation of the master and slave latch with a clock signal.

8. The flip-flop of claim 7, wherein the third clock gated transistor is a PMOS transistor, and the fourth clock gated transistor is an NMOS transistor.

9. The flip-flop of claim 3 wherein:
   both of the forward and reverse inverter of the slave latch are connected to a voltage supply via a transistor that is controlled by a voltage at a node of the master latch;
   the transistor connecting the forward inverter of the slave latch to the voltage supply is configured to cause the voltage supplied to the forward inverter of the slave latch to float when the output node of the reverse inverter of the master latch is high; and
   the transistor connecting the reverse inverter of the slave latch to the voltage supply is configured to cause the voltage supplied to the reverse inverter of the slave latch to float when the output node of the forward inverter of the master latch is high.

10. The flip-flop of claim 9, wherein at least one of the forward and reverse inverter of the master latch is connected to a voltage supply via a transistor that is controlled by a data voltage.

11. The flip-flop of claim 10, wherein:
both of the forward and reverse inverter of the master latch are connected to a voltage supply via a transistor that is controlled by a data voltage;
the transistor connecting the forward inverter of the master latch to the voltage supply is configured to cause the voltage supplied to the forward inverter of the master latch to float when the data voltage is high; and
the transistor connecting the reverse inverter of the master latch to the voltage supply is configured to cause the voltage supplied to the reverse inverter of the master latch to float when the data voltage is high.

12. The flip-flop of claim 1, wherein both connections between the cross-coupled logic gates of the slave latch, or the master latch, comprise a series resistive element.

13. The flip-flop of claim 12, wherein both cross-coupling connections of the slave latch and the master latch comprise a series resistive element.

14. A memory module, microcontroller or electronic device comprising the flip-flop of claim 1.

* * * * *